(12) United States Patent
Wright et al.

(10) Patent No.: US 7,546,507 B1
(45) Date of Patent: Jun. 9, 2009

(54) METHOD AND APPARATUS FOR DEBUGGING SEMICONDUCTOR DEVICES

(75) Inventors: Adam J. Wright, Saratoga, CA (US); Daniel Reilly, Mountain View, CA (US); Yoke Mooi Lee, Penang (MY)

(73) Assignee: Altera Corporation, San Jose, CA (US)

( * ) Notice: Subject to any disclaimer, the term of this patent is extended or adjusted under 35 U.S.C. 154(b) by 213 days.

(21) Appl. No.: 11/292,494

(22) Filed: Dec. 2, 2005

(51) Int. Cl.
*G01R 31/28* (2006.01)
*G06F 11/00* (2006.01)

(52) U.S. Cl. .................................... 714/742
(58) Field of Classification Search ............ 714/42
See application file for complete search history.

(56) References Cited

U.S. PATENT DOCUMENTS 5,720,031 A * 2/1998 Lindsay .................. 714/42
7,009,625 B2 * 3/2006 Dickinson ............... 345/629
7,103,800 B2 * 9/2006 Hasako et al. ........... 714/25

* cited by examiner

*Primary Examiner*—James C Kerveros
(74) *Attorney, Agent, or Firm*—Martine Penilla & Gencarella, LLP

(57) ABSTRACT

A tool for testing an integrated circuit is provided. The tool includes a vector execution engine, a vector image generation engine and a vector display engine. The vector execution engine applies test patterns to the integrated circuit and captures error data being output from the test patterns. The vector image generation engine generates a file of expected output from the application of the test patterns to the integrated circuit. It should be appreciated that the generation of the vector image file occurs offline from the testing by the vector execution engine. The tool also includes a vector display engine allowing identification of vectors including error data. In one embodiment, a timestamp is associated with the vectors of the vector image file and a timestamp is associated with the vectors of the error data. A method for testing an integrated circuit and a graphical user interface are also included.

22 Claims, 7 Drawing Sheets

Fig. 5

METHOD AND APPARATUS FOR DEBUGGING SEMICONDUCTOR DEVICES

BACKGROUND

The present invention relates to the testing of integrated circuits. More specifically, in one embodiment, the invention provides an improved system for testing an integrated circuit. With the high level of complexity of integrated circuits, it is becoming increasingly difficult to test the integrated circuits to ensure that they were manufactured with no defects. Typically, a device under test (DUT) is tested by applying predetermined waveform patterns to the DUT's input pins. A tester generates the waveforms and monitors the DUT's output pins to ensure that the device operates as expected.

Often, the waveform patterns needed to adequately test the DUT are complex. In turn, capturing the output from these complex waveform patterns requires relatively large amounts of memory and the memory requirements are becoming greater as the integrated circuits are becoming more complex. While running the test on a complex integrated circuit, variants of pieces of data go through the chip. Typically all the output data is dumped and collected as bit streams of ones and zeros. As this output is becoming larger, the time to analyze the data from the test and make any corrections to the integrated circuit is becoming greater. Consequently, the lead-time from first silicon to the ability to sell or distribute the integrated circuit is becoming greater.

As a result, there is a need to solve the problems of the prior art to reduce the amount of time required to debug and test a semiconductor device.

SUMMARY

Broadly speaking, the present invention fills these needs by providing a method and apparatus for testing/debugging integrated circuits in an efficient manner. It should be appreciated that the present invention can be implemented in numerous ways, including as a method, a system, or an apparatus. Several inventive embodiments of the present invention are described below.

In one aspect of the invention, a method for testing an integrated circuit is provided. In the method a vector image of the test pattern is generated. The vector image represents the expected output from the test pattern being applied to the integrated circuit. It should be appreciated that the expected output is created offline from the actual testing of the integrated circuit. Thus, the test patterns are applied to the integrated circuit and the errors are collected in an error file, as opposed to a massive file of all the test data. A timestamp associated with the error, and shared with the vector image, is identified and subsequently used to locate a corresponding vector within the vector image. Of course, the method operations may be embodied on a computer readable medium as computer code to be executed by a computing system.

In another aspect of the invention, a tool for testing an integrated circuit is provided. The tool includes a vector execution engine, a vector image generation engine and a vector display engine. The vector execution engine applies test patterns to the integrated circuit and captures error data being output from the application of the test patterns. Thus, the vector execution engine operates/controls the tester to apply the test patterns to the integrated circuit. The vector image generation engine generates a file of expected output from the application of the test patterns to the integrated circuit. It should be appreciated that the generation of the vector image file occurs offline from the testing by the vector execution engine. Thus, the data collection is decoupled from the data debug, thereby enabling distribution of debug work to maximize engineering efficiency. The tool also includes a vector display engine allowing identification of vectors including error data. In one embodiment, a timestamp is associated with the vectors of the vector image file and a timestamp is associated with the vectors of the error data. These timestamps are synchronized so that a vector from the error data may be paired with a vector from the vector image file by matching corresponding timestamps through the vector display engine.

In yet another aspect of the invention, a graphical user interface (GUI) to be used in conjunction with testing an integrated circuit is provided. The GUI is configured to display vectors having a bit or multiple bits in error. The vectors, and neighboring vectors, are displayed in a fashion that indicates temporal aspects and spatial features. In one embodiment, the temporal aspects are provided through the timestamp, while the spatial features indicate the pins of the integrated circuit outputting the bits of the vectors. Additionally, comments associated with the vectors are displayed. These comments may originate from developers and provide further details on the nature of the vector and any relationships to other vectors or functionality provided by the integrated circuit.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 5 illustrates an exemplary vector display application window with vectors loaded therein and an example of how a failing location is interpreted in accordance with one embodiment of the invention.

DETAILED DESCRIPTION

An invention is described for an apparatus and method that enables the efficient debugging of an integrated circuit by decoupling the data collection process from the data debug process. It will be obvious, however, to one skilled in the art, that the present invention may be practiced without some or all of these specific details. In other instances, well known process operations have not been described in detail in order not to unnecessarily obscure the present invention.

The embodiments described herein describe a method, device, and user interface that maximizes the engineering efficiency for debugging an integrated circuit. Described herein is a framework designed to automate and accelerate vector debug efforts, so that root causes of execution failures can be better targeted and test issues can be resolved more quickly. In one embodiment, two primary processes occur in the framework. The two primary processes are image creation and error capture. These two processes are decoupled to allow for maximum engineering efficiency. That is, the image creation, which is described in further detail below, is performed offline from the error capture. The data files generated by these two processes are linked through a timestamp that functions as a synchronization signal. Thus, the vectors having errors identified through the error capture may be associated with a corresponding vector of the image creation through the timestamp. A vector display application pairs the error identified through the error capture with the corresponding vector of the image creation. The vector display application includes functionality to enable a user to easily navigate between errors through a graphical user interface (GUI). In addition, the GUI links the temporal information, i.e., the timestamp, with spatial information, i.e., the pin where the error occurred.

Figure 1:
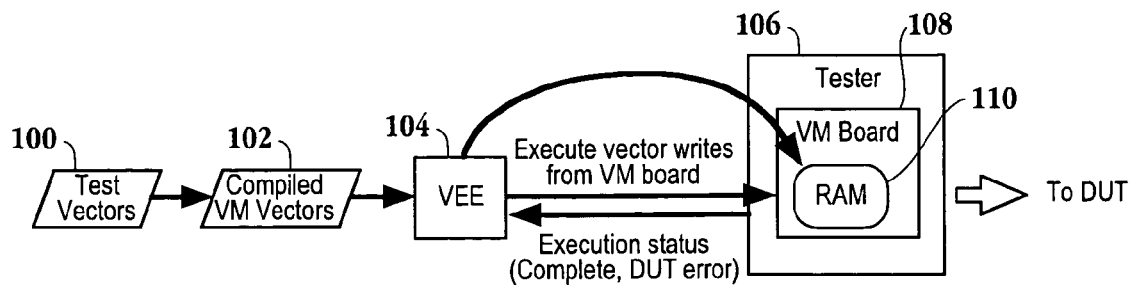
FIG. 1 is a high level schematic diagram illustrating the flow of running test vectors in "vector memory" (VM) mode in accordance with one embodiment of the invention.

FIG. 1 is a high level schematic diagram illustrating the flow of running test vectors in "vector memory" (VM) mode in accordance with one embodiment of the invention. It should be appreciated that the term vector memory (VM) was adopted by the assignee and has no significant meaning other than referring to a mode of operation Test vectors in module 100 are compiled into VM vectors in module 102. In one embodiment, the VM vectors are compiled through the "/v" option via a test vector compiler. Vector Execution Engine (VEE) 104 assembles the respective VM vectors into 32 bit writes, loads the vector writes onto random access memory (RAM) 110 of VM board 108 and then executes the vector writes from RAM 110. As illustrated in FIG. 1, tester 106 houses VM board 108 and its onboard RAM 110. The status of the vector execution is checked until the process is complete or halted. VEE 104 will then retrieve device under test (DUT) error bit state from the execution status register on the controller board, and report the run result as a pass or fail.

Figure 2:
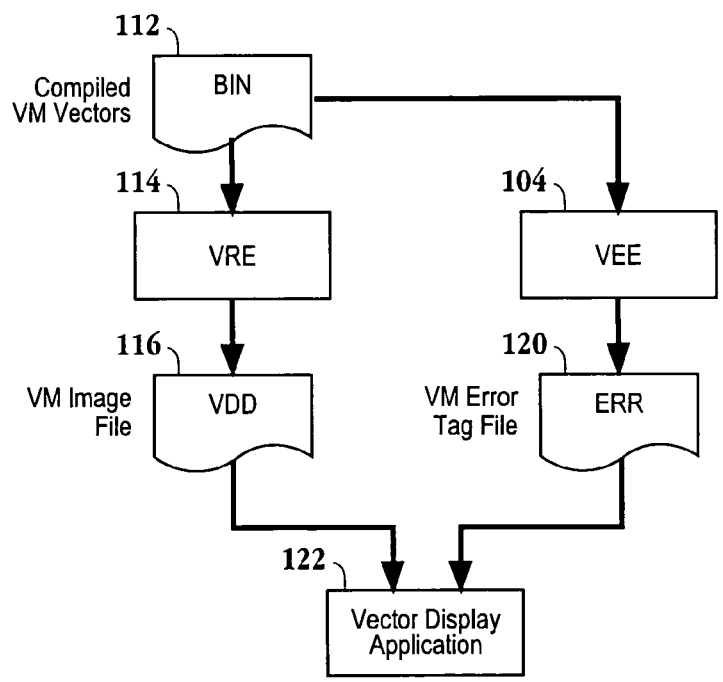
FIG. 2 is a high level simplified schematic diagram of the VM vector debug framework in accordance with one embodiment of the invention.

FIG. 2 is a high level simplified schematic diagram of the VM vector debug framework in accordance with one embodiment of the invention. As illustrated in FIG. 2, the framework includes three applications (Vector Reconstruction Engine (VRE) 114, VEE 104, and Vector Display Application 122.) Additionally, three intermediate files (BIN 112, VDD 116, and ERR 120) are employed to facilitate VM vector debug when operating in an off-line debug manner. Test vectors to be input into a chip to be tested are compiled. A compiler fits the vector into binary data into BIN file 112, i.e., the binary data includes compilation of the test vectors to be tested on the chip. BIN file 112 outputs the compiled vectors to VEE 104. On this side of the path from BIN file 112, the VM error is captured, if any, into ERR file 120. VM errors are captured and stored in a defined file called VM error tag file 120. Here, the error data resulting from the applied test patterns to the DUT is captured. In one embodiment, the error tag file format is made flexible enough to support both signal test debugging and bulk test debugging. It should be appreciated that test programs are run from VEE 104. Thus, rather than capturing a great deal of data, ERR file 120 captures just the pertinent information, i.e., the errors, resulting in a small footprint for this file.

Figure 3:
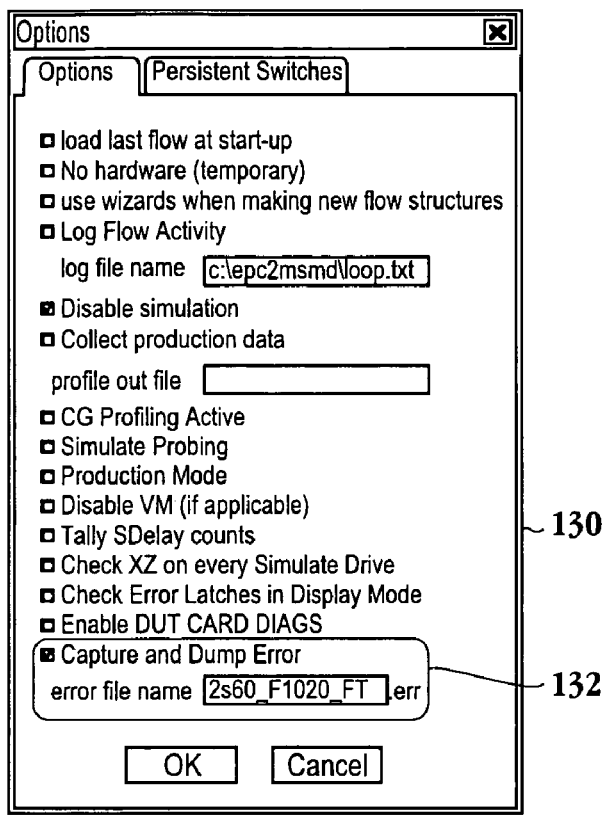
FIG. 3 is an exemplary user interface enabling a user to set preferences for the display of the error information in accordance with one embodiment of the invention.
Figure 4:
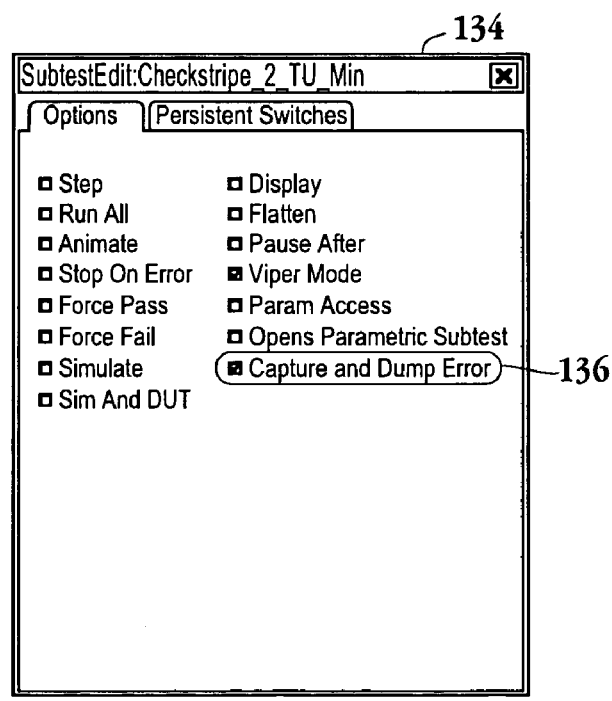
FIG. 4 is an exemplary interface allowing a user to disable or enable a capture operation in accordance with one embodiment of the invention.

In one embodiment, a dialogue box provided through the vector display application, e.g., dialogue box 130 of FIG. 3, includes check boxes so that a user may choose to enable or disable certain functionality. For example, the check box associated with region 132 allows a user to enable or disable a capture operation when a test fails. Within region 132, a user may specify an error file name. Alternatively, if an error file name is not specified within region 132 of the GUI, a default file name is used. The ability to enable or disable the capture operation when a test fails is similarly in a subtest edit dialogue box as illustrated through GUI 134 of FIG. 4. It should be noted that through GUI 134 a user has the ability to enable error capture at the subtest level by checking the check box in region 136. This is beneficial when performing error data collected for low yield tests in the production environment.

Returning to FIG. 2, proceeding down the left hand side of the figure, a VM image file is generated from BIN file 112 data through VRE 114. A VM image file represents a sequence of vectors to be executed when BIN file 112 is run in VM mode. The VM image file may be referred to as an expected vector image file generated from a source of test patterns, i.e., BIN file 112, to be applied to a DUT. The VM image file is stored in vector display dump (VDD) file format. After obtaining the VM image file in VDD 116 and VM ERR file in ERR 120, the data is merged through vector display application 122. Vector display application 122 reveals failing vector end channels that will be presented to users through an interactive vector display application. Vector display application 122 merges the data contained in the VM image file and the VM error tag file through a time stamp that acts as a synchronization signal for merging the data from these files.

Figure 5:
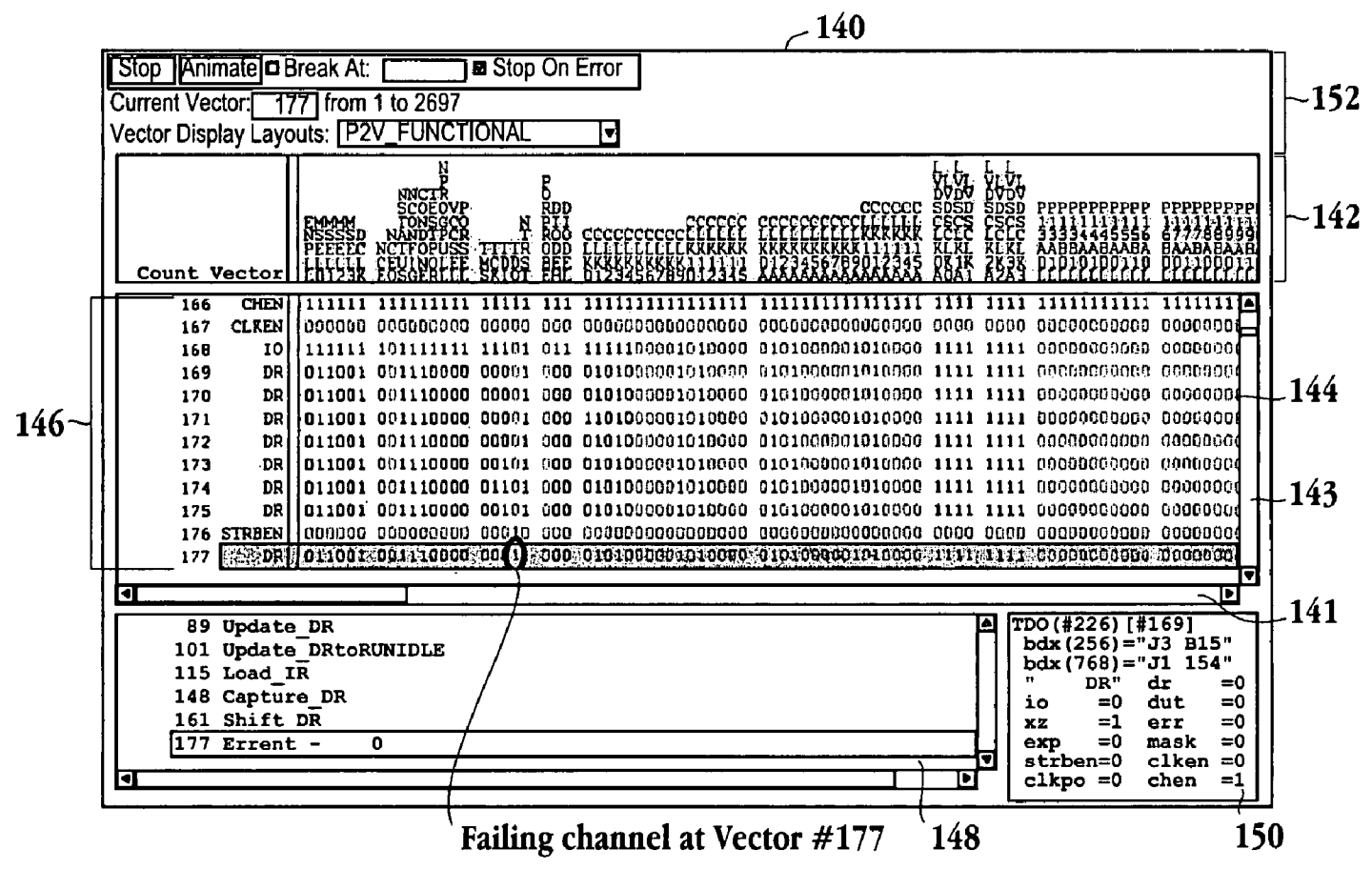

FIG. 5 illustrates an exemplary vector display application window with vectors loaded therein and an example of how a failing location is interpreted in accordance with one embodiment of the invention. Graphical user interface (GUI) 140 includes a number of regions providing information and associated functionality for navigating through the information. Region 142 lists a number of pin identifiers representing the pins on the device under test. Region 144 supplies the vector bit streams and region 146 supplies a sequential number to each of the vector bit streams along with a vector description. Navigation of the vector bit sequence may be achieved through scroll bars 141 and 143. Region 148 provides a window area where comments may be illustrated and evaluated as the data is being generated. For example, a developer may include comments providing further information associated with a vector bit sequence that the vector display application presents. With regard to vector count 101, the corresponding comment indicates that the vector bit sequence is functioning to update a drive signal to run idle. As illustrated in GUI 140, a failing channel has been identified within vector 177. In one embodiment, the failing bit within the failing channel may be visually highlighted, e.g., displayed in a different color or highlighted by a different color background.

GUI 140 is a powerful tool for an engineer since the GUI provides spatial information, i.e., the pin of region 142 associated with the failing bit, and temporal information, i.e., the sequence number of the vector, as well as neighboring and previous vectors illustrated within region 146. Thus, a user may view neighboring vectors, both preceding and following the failing vector in time, within GUI 140. Of course, the vector display application is capable of merging data within the VDD file with the ERR file data in order to generate the display. In one embodiment, a channel operates with two levels of latches, the first level of latches handles data sent to the tester's channels, by channel group basis. It should be appreciated that as used herein, a channel is a single electrical signal from the tester that reads/writes a 1 or 0 to the device under test. To load data contained in the first level latches into the second level latches simultaneously, a DRCLKOUT signal is asserted. The DRCLKOUT signal represents the application of all channel groups' data to the DUT and functions as a synchronization signal. Accordingly, the DRCLKOUT signal may be thought of as a timestamp. It should be noted that region 150 displays functionally what is happening to the chip. Region 152 provides preferences as to the display layout, such as whether to step or animate the display, and a sequence number of the current vector being displayed.

Figure 6:
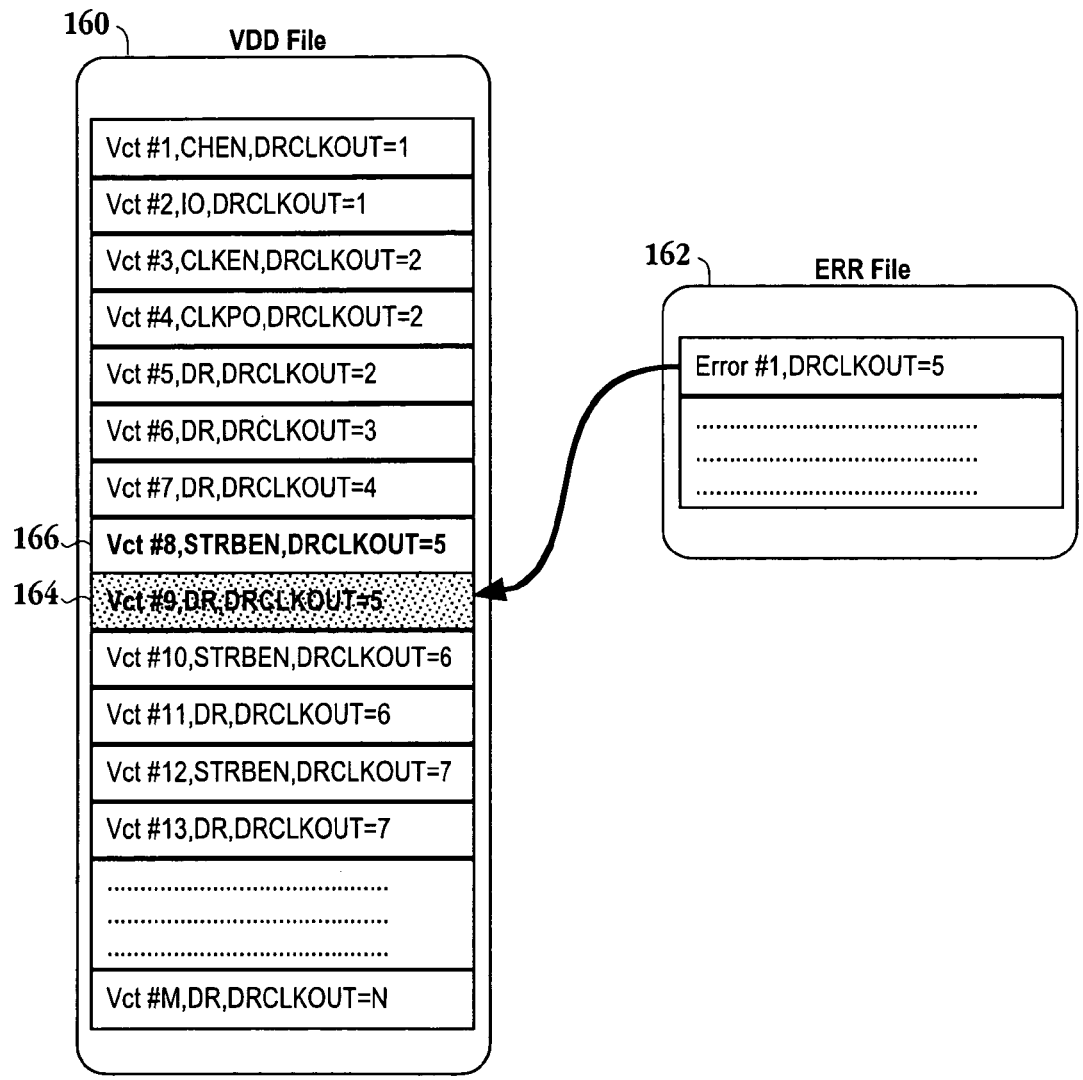
FIG. 6 is a simplified schematic diagram illustrating the identification of a failed vector number in the VM image file based on the error data provided in the VM error tag file in accordance with one embodiment of the invention.

FIG. 6 is a simplified schematic diagram illustrating the identification of a failed vector number in the VM image file based on the error data provided in the VM error tag file in accordance with one embodiment of the invention. It should be appreciated that each vector in VDD file 160 is assigned a DRCLKOUT number. As mentioned above, the DRCLK-OUT number represents a synchronization signal in which the error within error file 162 is matched with the corresponding vector of VDD file 160. Each vector in VDD file 160 is assigned a DRCLKOUT number and that DRCLKOUT number is relative to a test. For example, DRCLKOUT 1 has been assigned to vectors 1 and 2 as DRCLKOUT 1 is fired after loading channel group data contained in input/output (10) vector number 2 during the actual test execution. As illustrated in FIG. 6, the DRCLKOUT value that corresponds to error number 1 is DRCLKOUT 5. In one embodiment, DRCLKOUT 5 represents that the test failed and halted after five assertions of DRCLKOUT signal. Within VDD file 160, the vectors 166 and 164 are both associated with DRCLK-OUT 5. As vector number eight 166 is a strobe enable and represents configuration data, i.e., is not capable of causing an error, vector nine 164 is identified as the failing vector as it is associated with drive data. In one embodiment, to check for DUT error, loaded drive data is compared against data from the DUT using an XOR operation. In one embodiment, as soon as the XOR results are found high, the vector execution is halted top prevent assertion of subsequent DRCLKOUT signals.

Figure 7:
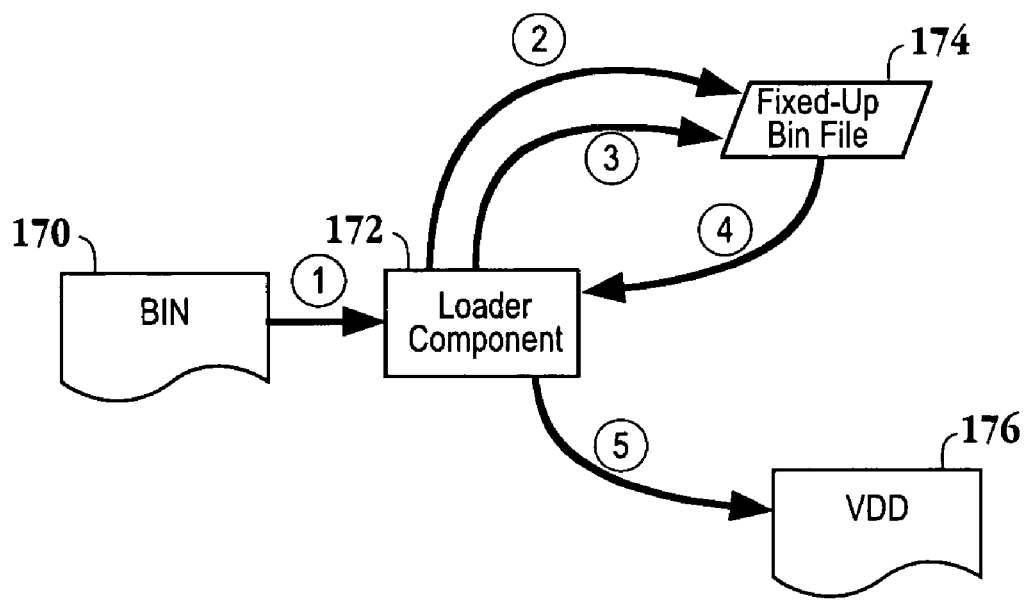
FIG. 7 is a simplified schematic diagram depicting the software mechanism used for VM image creation from the BIN file in accordance with one embodiment of the invention.

FIG. 7 is a simplified schematic diagram depicting the software mechanism used for VM image creation from the BIN file in accordance with one embodiment of the invention. In one embodiment, the VM image generator is a stand-alone Win32 console application that will take BIN file 170 and create its respective VM image VDD file. Loader component 172 is a component of the VEE that deals with the BIN file and loads and runs the test program. The embodiments represented in FIG. 7 are used when loader component 172 loads BIN program 170 to the VM RAM. Fixed-up loaded BIN file 174 is generated after the run. Trap channel commands and writeln data are returned to loader component 172. Thereafter, the VM image is created and formatted as VDD file 176. In one embodiment, Loader component 172 is extended to construct VDD-style vectors from the assembled channel group write data and the trapped writ back data. It should be appreciated that the VM image creation is hardware independent and does not require communication with the tester. Table 1 summarizes the channel functions and their corresponding vector types.

TABLE 1

| Channel Funcction | Vector Type | Remarks |
|---|---|---|
| CF_DATA | DR | |
| CV_DATACLK | DR | DRCLKOUT signal will be asserted after CG data is loaded. Increment DRCLKOUT count by 1. |
| CF_IO | IO | |
| CF_FREEZE | CHEN | Requires inversion f 32-bit CG data. |
| CF_CLKEN | CLKEN | |
| CF_CLKPO | CLKPO | |
| CF_STROBEEN | STRBEN | |
| CF_NOP | — | Will not be reflected in VM image. |
| CF_VMDELAY | — | Will not be reflected in VM image. |

In one embodiment, DRCLKOUT is increased or incremented for every channel group write data that pertains to CF_DATACLK.

Figure 8:
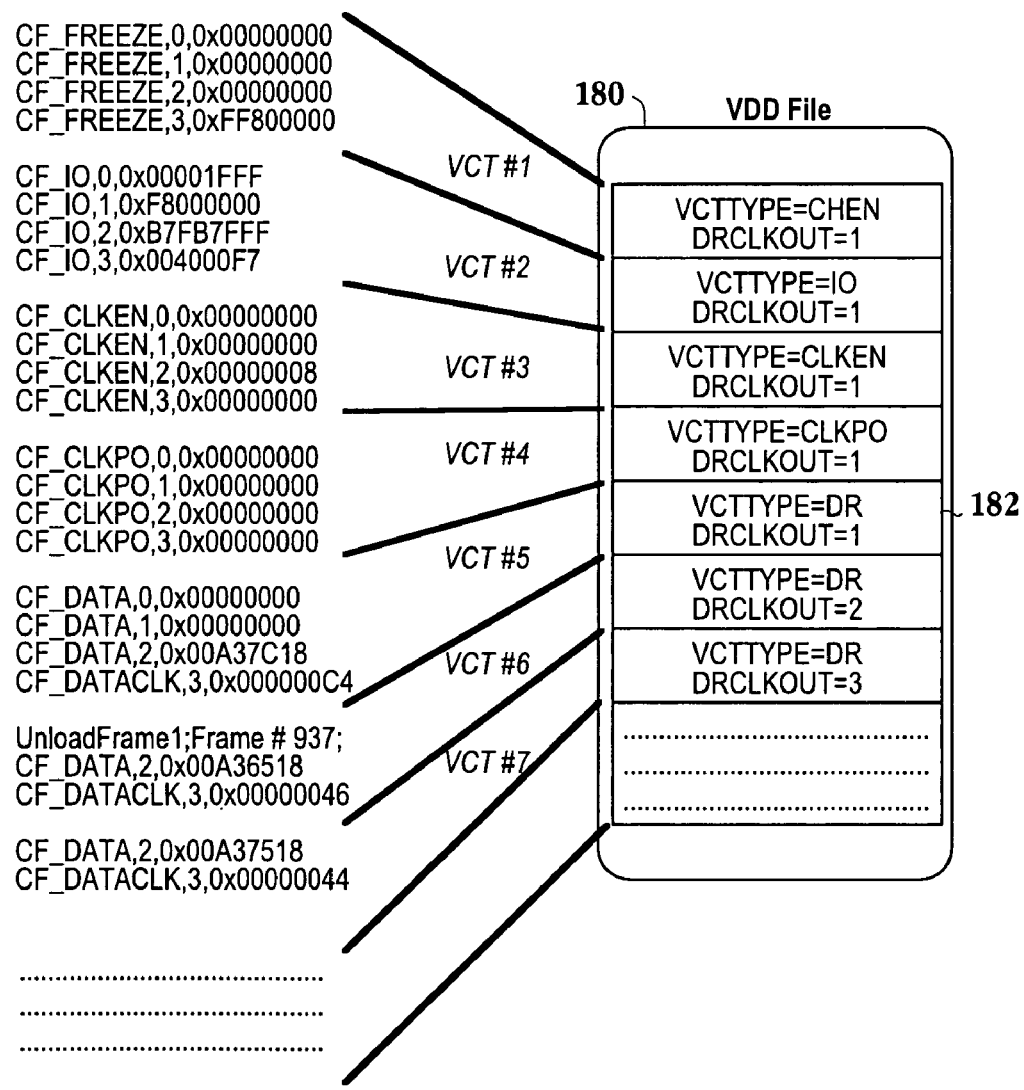
FIG. 8 illustrates the building of VDD file from channel group write data and written data in accordance with one embodiment of the invention.

FIG. 8 illustrates the building of VDD file from channel group write data and writeln data in accordance with one embodiment of the invention. Consecutive channel group writes of the same vector type and DRCLKOUT count will be grouped into the same vector in VDD file 180. The writeln data will also be integrated into a current active vector during the VM image creation. As illustrated, the DRCLKOUT is incremented upon drive operations. In FIG. 8, the first drive is associated with vector number 8 in module 182.

Figure 9:
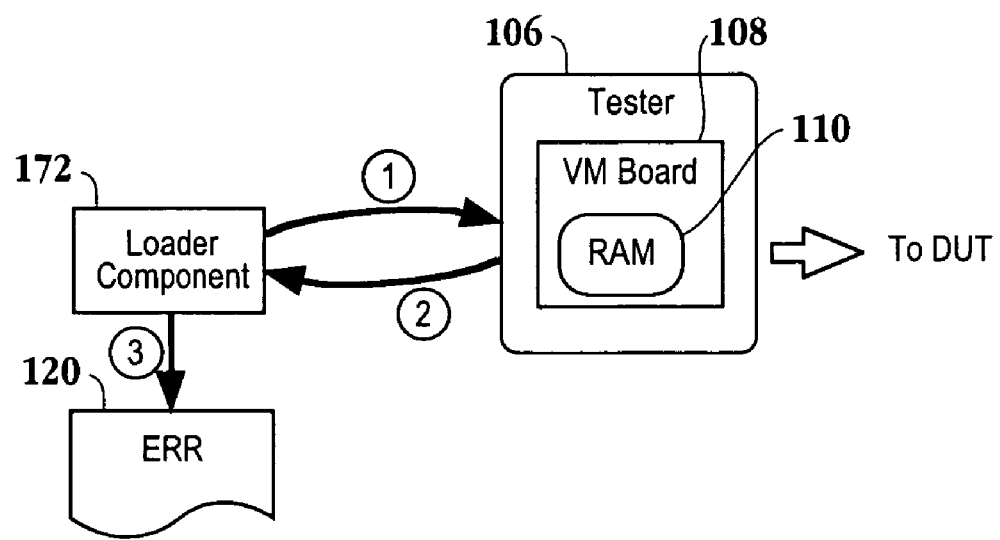
FIG. 9 is a simplified schematic diagram illustrating the management of VM test execution through the loader in accordance with one embodiment of the invention.

FIG. 9 is a simplified schematic diagram illustrating the management of VM test execution through the loader in accordance with one embodiment of the invention. As illustrated, the VM test is run from RAM 110, which is located on VM board 108. VM board 108 is located within tester 106. An execution status is returned from tester 106 to loader component 172. If the test fails, the error data is built and added into ERR file 120. Tables 2 and 3 illustrate exemplary file formats for the body sections of the VDD file format and the ERR file format, respectively. Table 4 illustrates the structure of the error vector data associated with Table 3. It should be appreciated that each of the body section in Tables 2 and 3 may have corresponding header sections.

TABLE 2

| Type | Data Name | Size (bytes) | Description |
|---|---|---|---|
| int | VECTOR_NUMBER | 4 | Primary vector number (same number that appears in FlowManagerNT's Vector Display). 1-based index. |

TABLE 2-continued

| Type | Data Name | Size (bytes) | Description |
|---|---|---|---|
| char | VECTOR_TYPE | 1 | Primary vector type if bit 7 is 1, then this vector is a scector |
| int | SEC_VCT_COUNT | 4 | Secondary vector count. Set to 1. |
| int[SEC_VCT_COUNT*2] | SEC_VCT_TIMES | 8*SEC_VCT_COUNT | Secondary vector simulation time 0 = upper 32 bits 1 = lower 32 bits |
| int | DR_CLK_OUT_NUMBER | 4 | VM DRCLKOUT counter value |
| int | VM_WORD_NUMBER | 4 | VM Limit counter value |
| CHAR | SCAN_CHAIN NUMBER | 1 | Current scan chain count. Set to 0. |
| int | WRITELN_CHAR_COUNT | 4 | Writeln character count |
| char[WRITELN_CHAR_COUNT] | WRITELN | WRITELN_CHAR_COUNT | Writeln null-terminated string. |
| int | MESSAGE_COUNT | 4 | Message character count. Set to 0. |
| char[MESSAGE_COUNT] | MESSAGE* | MESSAGE_COUNT | Message null-terminated string. |

TABLE 3

| Type | Name | Size (bytes) | Description |
|---|---|---|---|
| char[16] | ERR_GUID | 16 | Global unique ID delivered from the associated BIN file. |
| short | LOOP_NUMBER | 2 | Loop count when the error occurs. Set to 1 if flow looping is not activated. |
| char | TEST_NAME_LENGTH | 1 | Test name character count. |
| char[TEST_NAME_LENGTH] | TEST_NAME | TEST_NAME_LENGTH | Test name. |
| char | SUBTEST_NAME_LENGTH | 1 | Subtest name character count. |
| char[SUBTEST_NAME_LENGTH] | SUBTEST_NAME | SUBTEST_NAME_LENGTH | Subtest name. |
| char | BINFILE_NAME_LENGTH | 1 | Bin file name character count. |
| char[BINFILE_NAME_LENGTH] | BINFILE_NAME | BINFILE_NAME_LENGTH | Bin file name. |
| time_t | TIME | 4 | Creation time of error data. |
| int | DIEX | 4 | Die X coordinate. |
| int | DIEY | 4 | Die Y coordinate. |
| char | VM_OPT | 1 | Flat to indicate whether VM optimization is turned on. |
| TTestConditonStruct | TEST_CONDITION | 28 | Test condition. struct TTestConditionStruct { int m_iVCC1; int m_iVCC2; int m_iVPP; int m_iVHH1; int m_iVHH2; int m_iVBB; int m_iTemperature; }; |
| short | ERR_VCTS_COUNT | 2 | Number of error vector data structures. Used to support multiple error capture operation. |

ERR_VCTS_COUNT of error vector data structures will be appended to the above structure in Table 3. Structure of each error vector data is defined as below in Table 4:

TABLE 4

| Type | Name | Size (bytes) | Description |
|---|---|---|---|
| int | DRCLKOUT_COUNT | 4 | DRCLKOUTs executed. |
| int | VM_LIMIT_COUNT | 4 | 32-bit VM words executed. |
| int[USED_CG_COUNT] | ERR_DATA | 4* USED_CG_COUNT | Error data. |

In summary, the above-described invention provides a method and apparatus for more efficiently testing integrated circuits. It should be appreciated that the embodiments described herein may be applied to any integrated circuit, including application specific integrated circuits, processors, programmable logic devices, e.g., field programmable gate arrays, and any other suitable integrated circuit that is to be tested or debugged. In addition, the embodiments described above may be combined with any tester, such as any testers commercially available, as well as board level systems. It should be appreciated that the GUI illustrated above is useful in testing/debugging integrated circuits efficiently. Because a user can easily navigate through the vector display user interface, and the decoupling of the data debugging and data collection, the chip can be more efficiently debugged. Since an error is typically propagated through the chip, once an error is identified spatially and temporally through the GUI, a design engineer is able to back up in time for each preceding signal to determine the exact cause of the error. Thus, a design engineer can view the data through the GUI of FIG. 5 and navigate back through the data in the time neighborhood of the output of the error. In one embodiment, a developer's comments are preserved and presented in the display to coincide with the temporal display of the vector to further assist the debugging process. Thus, the embodiments described herein strip out duplicate information and recreate that information away from the tester. The pertinent information is captured in the error file without all the unnecessary duplicate information, thereby reducing overhead. The error file and the recreated file are then merged through the vector display application to provide the display interfaces described above.

A programmable logic device as described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs writeln in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for testing an integrated circuit, comprising method operations of:
    creating an expected vector image file from a source of test patterns to be applied to a device under test (DUT);
    applying the test patterns to the DUT;
    capturing error data resulting from the applied test patterns in a file, wherein the file includes a table of errors and wherein each entry in the table is a data structure whose fields include a field for a count of synchronization signals and a field containing error data related to a synchronization signal identified by the count; and
    locating a portion of the vector image file associated with the error data through the synchronization signal count and wherein the method operations are executed by an integrated circuit.

2. The method of claim 1, further comprising:
displaying the portion of the vector image file highlighting the error data.

3. The method of claim 2, wherein the method operation of displaying the portion of the vector image file highlighting the error data includes,
displaying a temporal indicator of the vector image file illustrating when the error data occurred; and
displaying a spatial indicator of the vector image file illustrating a pin on which the error data occurred.

4. The method of claim 1, wherein the synchronization signal is a signal configured to drive output from the test patterns from the device under test.

5. The method of claim 4, wherein
the synchronization signal is a signal that simultaneously loads data in a first level of latches into a second level of latches.

6. The method of claim 5, wherein the method operation of locating a portion of the vector image file associated with the error data includes,
identifying a vector within the vector image file corresponding to a synchronization signal count having a same value as the synchronization signal count associated with error data.

7. The method of claim 1, wherein the method operation of creating an expected vector image file from a source of test patterns to be applied to a DUT is performed offline from the method operation of applying the test patterns to the DUT.

8. A computer readable medium having program instructions to be executed on a computing system for testing an integrated circuit, comprising:
program instructions for creating an expected vector image file from a source of test patterns to be applied to a device under test (DUT);
program instructions for applying the test patterns to the DUT;
program instructions for capturing error data resulting from the applied test patterns in a file, wherein the file includes a table of errors and wherein each entry in the table is a data structure whose fields include a field for a count of synchronization signals and a field containing error data related to a synchronization signal identified by the count; and
program instructions for locating a portion of the vector image file associated with the error data through the synchronization signal count.

9. The computer readable medium of claim 7, further comprising:
program instructions for displaying the portion of the vector image file highlighting the error data.

10. The computer readable medium of claim 9, wherein the program instructions for displaying the portion of the vector image file highlighting the error data includes,
program instructions for displaying a temporal indicator of the vector image file illustrating when the error data occurred; and
program instructions for displaying a spatial indicator of the vector image file illustrating a pin on which the error data occurred.

11. The computer readable medium of claim 8, wherein the synchronization signal is a signal configured to drive output from the test patterns from the device under test.

12. The computer readable medium of claim 8, wherein the the synchronization signal is a signal that simultaneously loads data in a first level of latches into a second level of latches.

13. The computer readable medium of claim 12, wherein the program instructions for locating a portion of the vector image file associated with the error data includes,
program instructions for identifying a vector within the vector image file corresponding to a synchronization signal count having a same value as the synchronization signal count associated with error data.

14. A tool, which runs on a processor, for testing an integrated circuit, comprising:
a vector execution engine configured to apply test patterns to the integrated circuit and capture error data in an error data file, wherein the error data file includes a table of errors and wherein each entry in the table is a data structure whose fields include a field for a timestamp value and a field containing error data related to the timestamp value and wherein the error data represent failures generated from output of the test patterns applied to the integrated circuit;
a vector image generation engine configured to construct a vector image file of expected output from the integrated circuit after application of the test patterns, the vector image generation engine constructing the vector image file offline from the vector execution engine's application of the test patterns; and
a vector display engine configured to display a vector including the error data, the vector display engine further configured to identify the vector including the error data by pairing captured error data with a corresponding vector of the vector image file through the timestamp value.

15. The tool of claim 14, wherein the vector display engine displays neighboring vectors of the vector including the error data and comments related to functionality of the neighboring vectors and the vector including the error data.

16. The tool of claim 14, wherein the vector display engine displays a temporal portion indicating when the vector including the error data is output and a spatial portion indicating a pin on which a bit of the vector including the error data is output from.

17. The tool of claim 14, wherein the vector display engine visually highlights a bit in error within the vector including the error data on a display screen.

18. A graphical user interface (GUI) for debugging an integrated circuit, comprising:
a first region configured to display vectors in temporal order, the vectors including a vector having a bit error and neighboring vectors, wherein the bit error is associated with a synchronization signal in a sequence of synchronization signals through a sequence counter whose value is recorded in a data structure for the bit error in a file and wherein the data structure for the bit error also includes error data related to the synchronization signal;
a second region configured to display locations from which bits of each of the vectors are output from; and
a third region configured to display comments associated with the vectors in the first region, the comments identifying functionality associated with the vectors in the first region.

19. The GUI of claim 18, further comprising:
a fourth region displaying information associated with functionally what is occurring in the integrated circuit during a timeframe represented by the temporal order.

20. The GUI of claim 18 wherein the first region is further configured to visually highlight the bit error.

21. The GUI of claim 18 wherein the first region is configured to enable navigation between the vector having a bit error and another vector having a bit error.

22. The GUI of claim 18, wherein the locations represent pins of the integrated circuit.

* * * * *